(12) United States Patent
Schulze et al.

(10) Patent No.: US 8,101,506 B2
(45) Date of Patent: Jan. 24, 2012

(54) METHOD FOR PRODUCING A BURIED N-DOPED SEMICONDUCTOR ZONE IN A SEMICONDUCTOR BODY AND SEMICONDUCTOR COMPONENT

(75) Inventors: Hans-Joachim Schulze, Ottobrunn (DE); Josef Lutz, Chemnitz (DE); Franz-Josef Niedernostheide, Munster (DE); Ralf Siemieniec, Villach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/719,487

(22) Filed: Mar. 8, 2010

(65) Prior Publication Data

US 2010/0167509 A1 Jul. 1, 2010

Related U.S. Application Data

(62) Division of application No. 11/201,874, filed on Aug. 11, 2005, now Pat. No. 7,675,108.

(30) Foreign Application Priority Data

Aug. 12, 2004 (DE) .......................... 10 2004 039 208

(51) Int. Cl.
*H01L 21/322* (2006.01)
(52) U.S. Cl. ....................................................... 438/474
(58) Field of Classification Search .................. None
See application file for complete search history.

(56) References Cited

U.S. PATENT DOCUMENTS

| | | | |
|---|---|---|---|
| 4,379,306 A | 4/1983 | Chatterjee et al. | |
| 6,351,024 B1 | 2/2002 | Ruff et al. | |
| 6,475,876 B2 | 11/2002 | Galster et al. | |
| 6,610,572 B1 | 8/2003 | Takei et al. | |
| 2001/0030331 A1* | 10/2001 | Minato | 257/138 |
| 2003/0054641 A1 | 3/2003 | Binns et al. | |

FOREIGN PATENT DOCUMENTS

| | | |
|---|---|---|
| DE | 10053445 A1 | 5/2002 |
| DE | 10207522 A1 | 9/2002 |
| DE | 10240107 A1 | 3/2004 |
| DE | 10243758 A1 | 4/2004 |
| DE | 10245089 A1 | 4/2004 |
| EP | 0594049 A1 | 4/1994 |
| EP | 0969501 A1 | 1/2000 |

OTHER PUBLICATIONS

"13-kV Rectifiers: Studies on Diodes and Asymmetric Thyristors", F.J. Niedernostheide, et al., IEEE 2003 (4 pgs.).
D. Widmann et al., Technologie hochintegrierter Schaltungen, S. Auflage, Berlin [a.u.]:Springer, 1996 (Halbleiter-Elektronik 19), pp. 42-43; ISBN: 3-540-59357-8.
P. Taylor, "Thyristor Design and Realization", John Wiley & Sons, 1992, pp. 162-163.
Ammerlaan: "Thermal double donors in c-Si", Jan. 1998, pp. 663-668.
Heywang et al.: "Halbleiter-Elektronik; Geleitwort der Herausgeber", 3.2 The monocrystalline silicon wafers, 1996.

* cited by examiner

*Primary Examiner* — Benjamin Sandvik
(74) *Attorney, Agent, or Firm* — Dicke, Billig & Czaja, PLLC

(57) ABSTRACT

A method for producing a buried n-doped semiconductor zone in a semiconductor body. In one embodiment, the method includes producing an oxygen concentration at least in the region to be doped in the semiconductor body. The semiconductor body is irradiated via one side with nondoping particles for producing defects in the region to be doped. A thermal process is carried out. The invention additionally relates to a semiconductor component with a field stop zone.

16 Claims, 4 Drawing Sheets a)

b)

METHOD FOR PRODUCING A BURIED N-DOPED SEMICONDUCTOR ZONE IN A SEMICONDUCTOR BODY AND SEMICONDUCTOR COMPONENT

CROSS-REFERENCE TO RELATED APPLICATIONS

This Divisional Patent Application claims priority to U.S. patent application Ser. No. 11/201,874, filed on Aug. 11, 2005, which claims priority to German Patent Application No. DE 10 2004 039 208.0-33, filed on Aug. 12, 2004, which is incorporated herein by reference.

FIELD OF THE INVENTION

The present invention relates to a method for producing a buried n-doped semiconductor zone in a semiconductor body.

BACKGROUND

Buried n-doped semiconductor zones are required as so-called buffer zones or field stop zones for example in vertical power components such as power IGBT, power diodes, power thyristors or power MOSFET. Components having n-doped (field stop) zones that are buried, that is to say arranged at a distance from a surface of a semiconductor body, are described, for example, in DE 100 53 445 C2, DE 102 43 758 A1, EP 0 594 049 A1 or DE 102 07 522 A1. The function and the advantages of field stop zones in power components are described, for example, in Niedernostheide, F.-J. et al.: "13 kV Rectifiers: Studies on Diodes and Asymmetric Thyristors", Proceedings ISPSD 2003 (Cambridge, UK), pages 122-125 or in DE 198 29 614 A1.

Buried field stop zones can be produced, for example, by means of sufficiently known epitaxy methods for depositing doped semiconductor layers successively on a semiconductor substrate the doping of which layers is chosen such that the desired doping profile is achieved in the resulting semiconductor body.

A further possibility for producing a buried n-doped semiconductor zone consists in producing the semiconductor zone as a doped zone of a first semiconductor body that is near the surface, which may be effected, for example, by means of a diffusion method during which dopant atoms are indiffused into the semiconductor body. The doped semiconductor body is subsequently connected to a second semiconductor body at the doped side, which results in a semiconductor body having a buried doped semiconductor zone. So-called wafer bonding methods are suitable for connecting the semiconductor bodies.

Both epitaxy methods and wafer bonding methods have the disadvantage of being complicated and therefore expensive. The wafer bonding method furthermore has the disadvantage that the charge carrier life time in the connected semiconductor body is significantly reduced in the region of the interface between the two original semiconductor bodies, which may adversely affect the function, in particular the turn-off behavior, of a component having a buried zone produced in this way.

DE 102 43 758 A1 describes producing a buried field stop zone by means of proton irradiation and a subsequent annealing step at temperatures of between 250° C. and 500° C. By means of the proton irradiation, on the one hand, defects are produced in the semiconductor body and, on the other hand, hydrogen is thereby introduced into the semiconductor body, hydrogen-induced donors or hydrogen-correlated donors arising from the defects and the hydrogen during the annealing step. The doping profiles produced by such a method essentially follow the distribution of the primary defects caused by the irradiation. The distribution has a Gaussian profile in the irradiation direction, the half value width in the case of proton irradiation being comparatively narrow, which results in a narrow doped zone in the case where only one irradiation energy is used.

SUMMARY

Embodiments of the present invention provide a method for producing a semiconductor and semiconductor component. In one embodiment, the present invention provides a method for producing a buried n-doped semiconductor zone in a semiconductor body. The method includes producing an oxygen concentration at least in a region to be doped in the semiconductor body. The semiconductor body via one side with nondoping particles for producing defects in the region to be doped. A thermal process on the semiconductor body.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
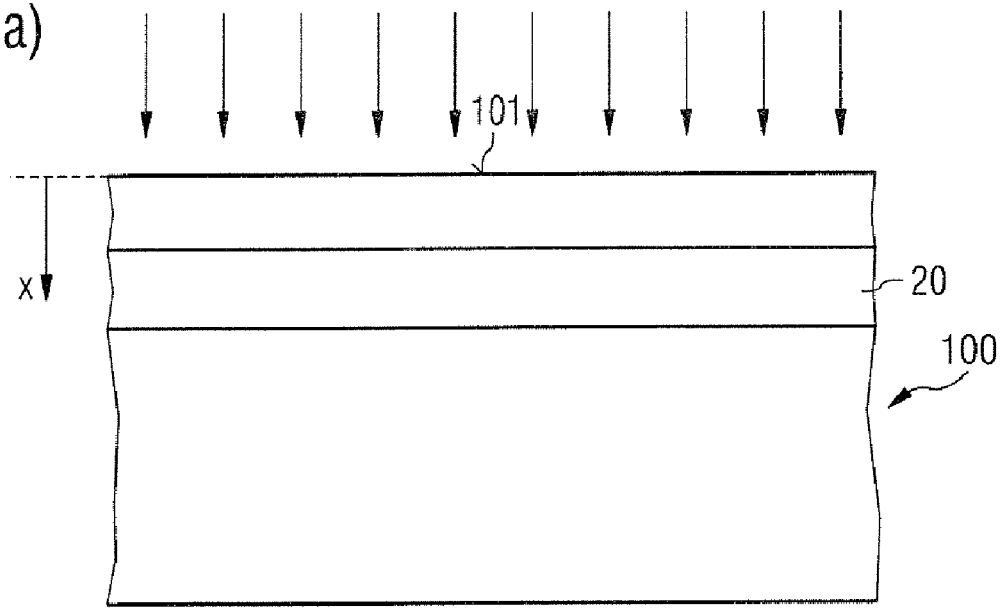
FIG. 1 illustrates a first exemplary embodiment of a method according to the invention for producing a buried n-doped semiconductor zone.
Figure 1:
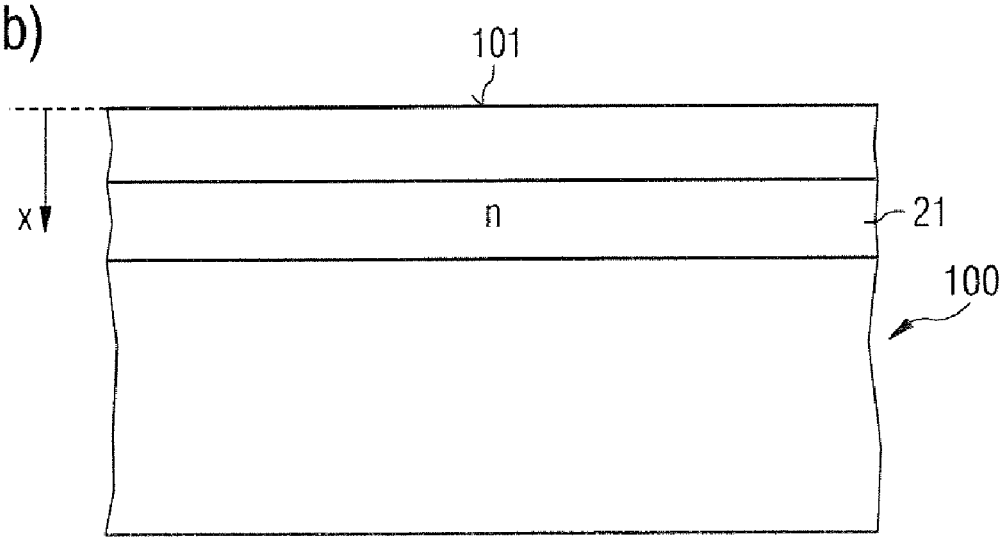

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a method for producing a buried n-doped semiconductor zone which enables in particular the production of wider doped zones.

In one embodiment, the method according to the invention for producing a buried n-doped semiconductor zone in a semiconductor body includes producing an oxygen concentration at least in the region to be doped in the semiconductor body, irradiating the semiconductor body via one side with nondoping particles for producing defects in the region to be doped, and carrying out a thermal step at temperatures of between 380° and 500°.

The particles used for the irradiation of the semiconductor body are preferably ions of more than monovalent elements, such as helium ions or carbon ions for example. Furthermore, semiconductor ions, such as silicon ions, for example, when using a silicon semiconductor body, are suitable.

In one embodiment of the method according to the invention, the defects produced by the irradiation are converted by a subsequent thermal process, so-called thermal double donors (TDDs) arising which include a defect nucleus and oxygen atoms attached to the defect nucleus. The donor profile formed is influenced by the primary defect profile, that is to say the profile of the primary defects established by the irradiation. The distribution profile of the donors in the semiconductor body corresponds to a profile broadened in comparison with the distribution profile of the primary defects if the oxygen concentration in the region of the primary defects may be assumed at least approximately to be uniformly distributed, i.e. does not fluctuate to an excessively great extent spatially in the region of the primary defects. The location of the maximum of the defect distribution proceeding from the radiation side or the distance between the location of this maximum and the irradiation side is dependent on the irradiation energy and the type of nondoping particles used.

The physical constitution of TDDs is described in C.A.J. Ammerlean EMIS Datareview Series No. 20 (1999), pp. 663-668.

The oxygen concentration in the semiconductor body that is required for forming the thermal double donors is set prior to the irradiation with nondoping particles, for example, by means of an oxidation step during which the semiconductor body is heated in an oxygen atmosphere. In the production of power components, such as power diodes, power IGBTs or power thyristors, for example, one of the first processes of the production method is usually such an oxidation process so that the semiconductor bodies used for producing power components have a sufficient oxygen concentration anyway, lying in the region of a few $10^{16}$ cm$^{-3}$.

In comparison with a known method, in which a buried n-doped semiconductor zone is produced by means of a proton implantation and a subsequent annealing step, the implantation of more than monovalent ions makes it possible to significantly increase the width of the region with high defect frequency and thus the width of the resultant region of high n-type doping. The gradient with which the doping concentration of the n-doped region produced by the method falls in the direction of such regions which are not doped by the method furthermore decreases. Simulations show that the turn-off behavior of power components, for example of power diodes, can be significantly improved if the components have a field stop zone with a doping profile in the vertical direction with respect to the surface with such a small gradient in the direction of the component interior. In the case of one method according to the invention, the semiconductor body can be irradiated over the whole area via the one side, which results in an n-doped semiconductor zone which is arranged at a distance from the one side in a vertical direction of the semiconductor body and which extends completely through the semiconductor body in a lateral direction.

The irradiation of the semiconductor body with the nondoping particles may additionally also be carried out in masked fashion using a mask, which results in buried n-doped sections whose dimensions in the lateral direction are essentially determined by the mask used during the irradiation.

Furthermore, there is the possibility, by means of the irradiation and the subsequent thermal step of obtaining a broadened doping profile of the TDDs by applying a continuous metallization layer, for example, made of aluminum, to the irradiation side, through which layer the irradiation is effected. The irradiation energy has to be increased in this case compared with irradiation without such a layer, in order to obtain the location of the maximum at a predetermined position.

The method explained up to now assumes that the oxygen concentration in the region in which primary defects are products is at least approximately constant. Such uniform distribution of the oxygen can be achieved by means of oxidation steps of corresponding length, and is present in particular in the region near the surface, that is to say the region in which field stop zones are usually produced in power components. In this method, the non-constant doping profile of the double donors is obtained by the production of primary defects that are not distributed uniformly.

A further embodiment provides for the doping profile of the double donors produced to be predetermined by a non-constant oxygen concentration profile. Such an oxygen profile can be set by suitable control of an oxidation process by which oxygen is indiffused into the semiconductor body, the diffusion temperature chosen during the diffusion operation and the diffusion duration determining the concentration profile of the indiffusing oxygen atoms. Primary defects are produced by means of an electron irradiation, for example, in this method. Such an electron irradiation leads, in a defect region predetermined by the irradiation energy, to an essentially homogeneous defect distribution in the vertical direction with respect to the wafer surface if the acceleration energy of the electrons is chosen to be sufficiently high. The irradiation is followed by a thermal step at temperatures of between 380° C. and 500° C., by means of which double donors are formed from the defects and the oxygen, the donor concentration essentially following the oxygen concentration. By means of such a method, it is possible to produce n-doped regions with a very shallow gradient of the doping profile.

Such a method for producing a doping profile with a shallow gradient is advantageously combined with an irradiation with nondoping, more than monovalent particles. The electron irradiation leads to a wider defect region with a lower maximum defect distribution, which gives rise in total, after the annealing step, to an n-doped zone having a section having a high doping concentration and a slow decrease in the doping concentration in the direction of regions not doped by the method.

FIG. 1a illustrates, in side view in cross section, one embodiment of a semiconductor body 100 during a first process of the method according to the invention, in which one side 101 of the semiconductor body 100 is irradiated with nondoping particles in order to implant these nondoping particles into the semiconductor body 100. In this embodiment, the irradiation side 101 is the front or rear side of the semiconductor body or semiconductor chip 100 depending on the intended use of the doped zone produced by the method.

The particles implanted into the semiconductor body 100 cause primary defects in the semiconductor body 100, the distribution of the primary defects in the irradiation direction, designated as the x direction in the figures, approximately following a Gaussian distribution. In this embodiment, the position of the maximum of the primary defect distribution or the distance between the maximum and the irradiation side 101 is dependent on the irradiation or implantation energy and the type of particles implanted. The implanted particles are preferably more than monovalent particles, such as helium ions, carbon ions or silicon ions, for example. The implantation energy is chosen depending on the desired implantation depth, which may be up to a few hundred μm in the case of components having a relatively high blocking capability. The implantation energies for helium for this purpose lie for example in the range between 0.15 MeV and 20 MeV.

A semiconductor region which is arranged at a distance from the irradiation side 101 and in which the maximum of the primary defects is located is designated by 20 in FIG. 1a.

The irradiation or implantation process is followed, in one embodiment of the method according to the invention, by an annealing step during which the semiconductor body is heated to temperatures of between 380° C. and 500° C., preferably between 420° C. and 460° C., for a predetermined duration. The duration of the annealing step lies between 20 minutes and 10 hours, preferably between 20 minutes and 2 hours.

In one embodiment, the method according to the invention presupposes that a predetermined oxygen concentration is present in the irradiated semiconductor body 100, which oxygen concentration lies for instance in the region of $10^{16}$ cm$^{-3}$ or above and is set for example by means of an oxidation step prior to irradiation of the semiconductor body 100. The semiconductor body preferably includes a so-called float zone semiconductor material, like float zone silicon. Such float zone semiconductor material is free from crucible contamination and therefore is almost free of oxygen. The oxygen concentration required for performing the method as described above is therefore set by suitable process like an oxidation process.

During the annealing process, thermal double donors are formed in the semiconductor body 100; the thermal double donors include the defects resulting from the irradiation and the oxygen atoms present and have an n-doping effect. In this embodiment, the distribution of the thermal double donors in the semiconductor body, and thus the profile of the doping concentration, follows the primary defect distribution resulting from the irradiation. The n-doped region which is present at a distance from the irradiation side 101 after the annealing in the semiconductor body 100 is designated by the reference symbol 21 in FIG. 1.

In the exemplary embodiment in accordance with FIG. 1, the semiconductor body 100 is irradiated over the whole area via the irradiation side 101, which results, after the annealing process, in an n-doped semiconductor zone 21 which is arranged at a distance from the irradiation side 101 and extends over the entire semiconductor body 100 in the lateral direction.

Figure 2:
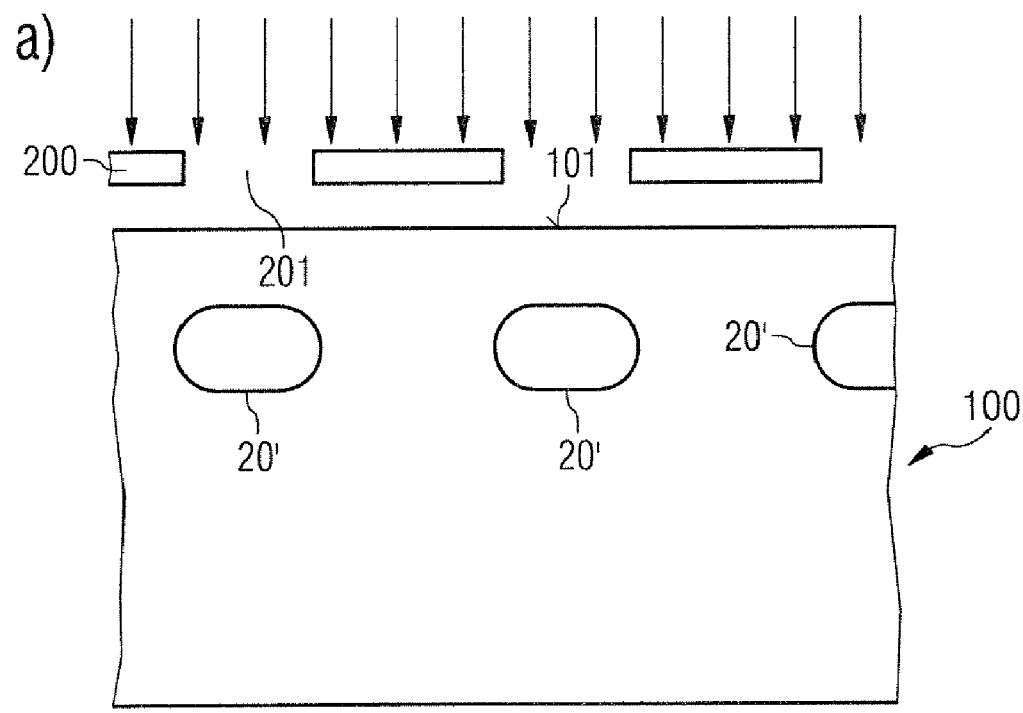
FIG. 2 illustrates a second exemplary embodiment of the method according to the invention during individual method steps.
Figure 2:
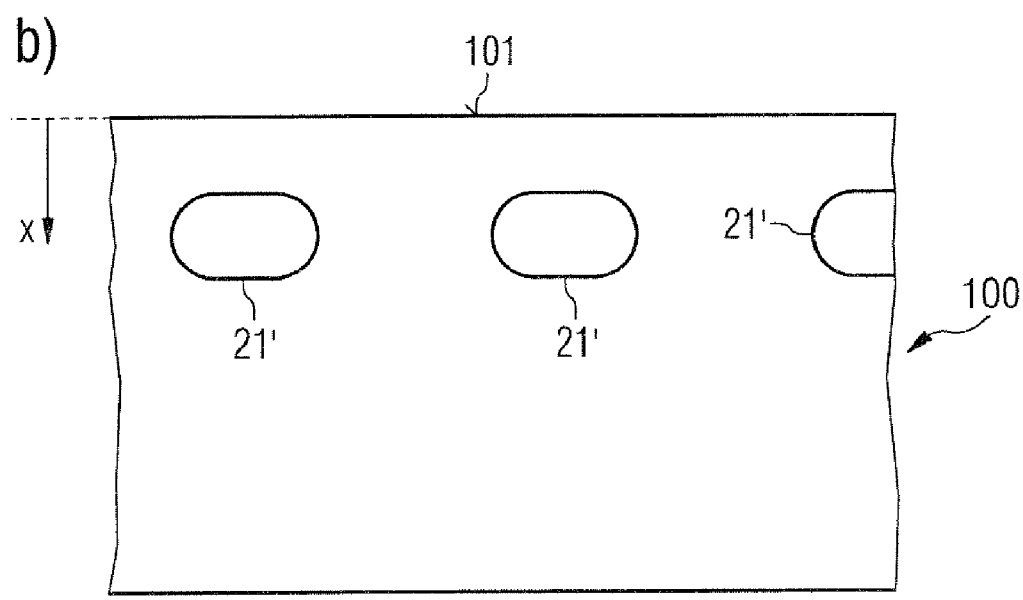

FIG. 2 illustrates a further exemplary embodiment of a method according to the invention, in which the irradiation side 101 is irradiated in masked fashion using a mask 200 having cutouts 201. The mask 200 protects predetermined sections of the semiconductor body 100 from irradiation, which gives rise, in the semiconductor body 100, to defect regions 20' only beneath the cutouts 201 of the mask 200. After the annealing process, the semiconductor body 100 contains a plurality of n-doped sections 21 which are arranged at a distance from one another in the lateral direction and whose distance from the irradiation side 101 is dependent, in the manner already explained, on the irradiation energy and the type of the particles used and whose spacing in the lateral direction of the semiconductor body 100 is dependent on the mask 200 used for the irradiation.

The mask 200 used for the irradiation is a metal mask, for example, which is either introduced at a distance from the surface of the semiconductor body 100 into the beam path between the irradiation source (not illustrated) and the semiconductor body 100, as is illustrated in FIG. 2a, but which may also be deposited directly onto the surface of the semiconductor body in order to be removed again after the irradiation process.

The method according to the invention is suitable, in particular, for producing n-doped field stop zones in power components such as power diodes, power IGBTs or power thyristors, for example.

Figure 3:
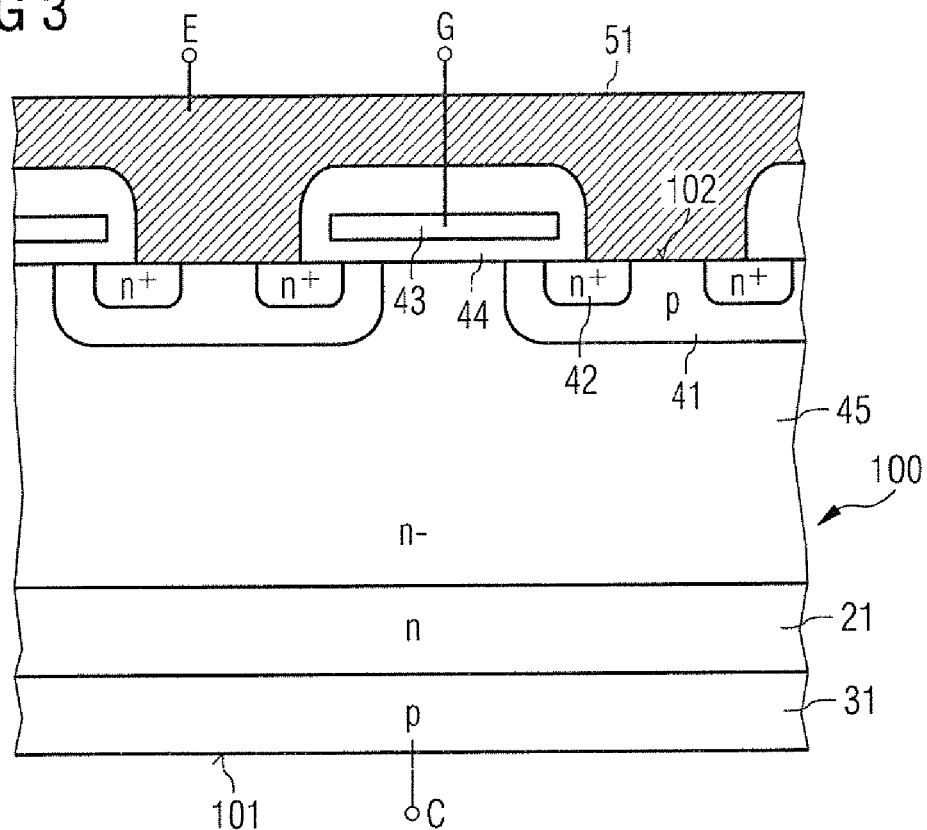
FIG. 3 illustrates, in side view in cross section, a power IGBT with an n-doped semiconductor zone produced by a method according to the invention.

FIG. 3 illustrates, in side view in cross section, a power IGBT having such an n-doped field stop zone. The initial basis for this power IGBT is formed by a weakly n-doped semiconductor body 100, in which a buried n-doped semiconductor zone is produced as field stop zone by means of the method according to the invention. In the component, the field stop zone 21 adjoins the p-type emitter 31 of the component, which emitter is formed in the region of a rear side of the semiconductor body 100. The irradiation of the semiconductor body with n-doping particles for producing the field stop zone 21 is effected, for the component illustrated, preferably via that side of the semiconductor body which forms the later rear side 101 of the component. The production of the p-type emitter 31 in the rear side region is effected for example by means of an implantation method via the rear side 101 and a subsequent annealing process. If the production of the p-type emitter is effected at temperatures greater than 500° C., then the production of the p-type emitter is effected before the method for producing the buried zone 21, since lower temperatures are required for this. It generally holds true that the process for producing this semiconductor zone 21 is to be incorporated into the overall process for producing the component such that processes having high temperatures than are required for producing the semiconductor zone 21 are carried out beforehand, and that processes having temperatures lower than are required for producing the semiconductor zone 21 are carried out afterward. The annealing process required for producing the thermal double donors (TDDs) may also be combined with other processes, for example, the heat treatment of contact layers.

A cell array having p-doped body zones or p-type base zones 41, n-doped n-type emitter zones 42 and a gate electrode 43 is present in a sufficiently known manner in the region of the front side 102 of the semiconductor body. In this embodiment, the gate electrode 43 is arranged in a manner insulated from the semiconductor body 100 and extends adjacent to channel zones arranged in the body zones 41 between the n-type emitter zones 42 and such sections 45 of the semiconductor body 100 which have the basic doping. The section 45 of the semiconductor body which is present between the field stop zone 21 and the body zones 41 and has the basic doping forms the drift zone or the n-type face of the IGBT.

Figure 4:
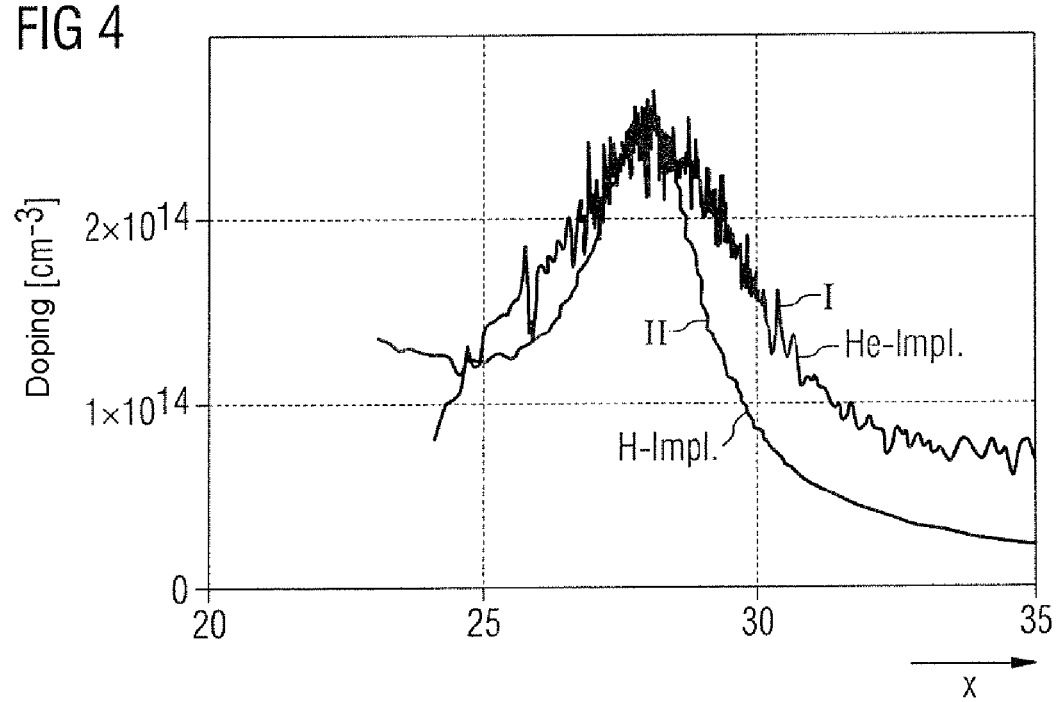
FIG. 4 illustrates a doping profile in an n-doped zone produced according to the invention in comparison with a zone produced by means of proton irradiation. The doping concentration is plotted against the depth of the semiconductor body proceeding from the irradiated side.

FIG. 4 illustrates, in a first curve I, the doping profile of an n-doped semiconductor zone produced by means of the method according to the invention in a silicon semiconductor body. In FIG. 4, the doping concentration of the semiconductor zone is plotted against the irradiation direction (x direction), the numerical values specified on the x axis designating the distance from the surface of the semiconductor body at the irradiation side. The doping concentration was determined by means of CV measurements (CV=capacitance-voltage) for the curve in FIG. 4.

The production of the n-doped semiconductor zone in the semiconductor body on which the measurement was based was effected by implantation of helium ions with an energy of 5.4 MeV and a dose of $7\cdot10^{10}$ cm$^{-2}$ and a subsequent annealing step at 430° C. and with a duration of 60 minutes. The oxygen concentration in the semiconductor body was approximately $10^{16}$ cm$^{-3}$.

In the example, the doping maximum is approximately $2.5\cdot10^{14}$ cm$^{-3}$ and the half value width of the doping distribution is approximately 5.3 μm. The half value width is, in a known manner, the distance between the two locations at which the doping concentration is still 50% of the maximum concentration.

For comparison, the doping profile for an n-doped semiconductor zone produced by proton irradiation and subsequent annealing is illustrated as curve II in FIG. 4. The irradiation parameters for the proton irradiation were chosen to produce a corresponding maximum doping concentration (peak concentration) of approximately $2.5\cdot10^{14}$ cm$^{-3}$. In this case, the irradiation energy for the protons was 1.5 MeV given an irradiation dose of $10^{13}$ cm$^{-2}$ and the annealing was effected at a temperature of 420° C. and with a duration of 30 minutes.

As can be gathered from the doping profile in curve II, the doped region resulting from the proton implantation has a substantially smaller half value width of only approximately 3.6 μm. Furthermore, in the case of the n-doped semiconductor zone produced by one embodiment of the method according to the invention, the gradient with which the doping concentration falls proceeding from the peak concentration is significantly smaller than in the case of the n-doped semiconductor zone produced by proton implantation. A small gradient of the profile of the doping concentration, i.e., a more weakly decreasing doping proceeding from the location of the peak concentration in the direction of that side of the semiconductor body which is remote from the irradiation side or proceeding from the location of the peak concentration further into the semiconductor body, is advantageous particularly when the n-doped semiconductor zone produced according to the invention is used as a field stop zone in power components, since a small gradient in this region of the doping profile has a positive effect on the turn-off behavior of the components.

The half value width in the case of the semiconductor zone 21, 21' with thermal double donors produced according to one embodiment of the method according to the invention increases with the range—controlled by way of the energy—or the penetration depth of the irradiation. The doping profile can be shifted nearer toward the surface by performing the irradiation through a metal layer or metal foil. By way of example, when a silicon semiconductor body is irradiated with helium nuclei having an energy of 5.4 MeV, the maximum of the doping is present at a penetration depth of 27 μm, and the half value width is between 4 μm and 7 μm. By way of example, in the case of irradiation through an aluminum layer having a thickness of 7 μm, the peak value of the doping concentration is 20 μm. In the case of irradiation through an even thicker layer, the peak value can be positioned nearer to the surface without the half value width and the associated shallow gradient changing.

It is likewise possible in this way to increase the half value width given a fixed depth of the doping maximum since, as the thickness of the layer through which radiation additionally passes increases the implantation energy has to be increased in order to obtain the same penetration depth, as a result of which the half value width increases.

Figure 5:
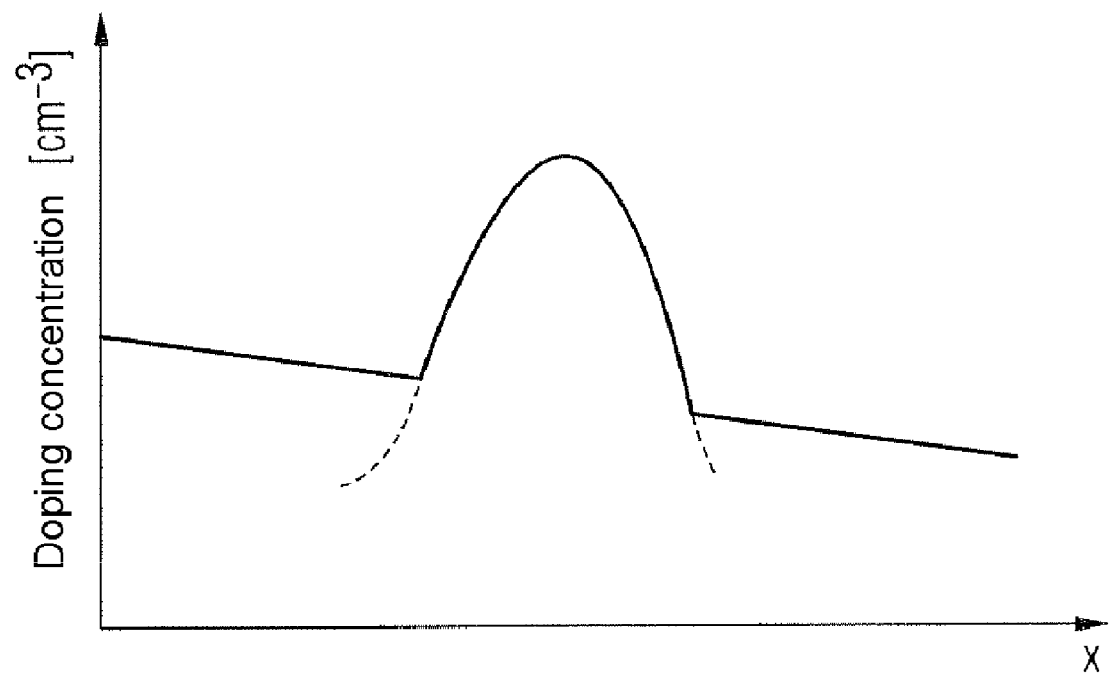
FIG. 5 illustrates the doping profile for a modification of a method according to the invention, in which an electron irradiation is effected besides an irradiation with nondoping particles.

The profile of the doping concentration proceeding from the peak concentration can be flattened even further. For this purpose, firstly a shallow oxygen profile is produced in the semiconductor body, i.e., the oxygen concentration is set such that it decreases with a small gradient proceeding from the surface. Such a region can be produced for example by indiffusion of oxygen into the semiconductor body. The semiconductor body is subsequently irradiated with electrons, thereby giving rise to defects distributed essentially homogeneously. The irradiation with the nondoping, more than monovalent particles is effected in addition to the electron irradiation. The irradiation steps may be followed by a common annealing step at temperatures of between 380° C. and 500° C., as a result of which recombination centers are essentially illuminated and thermal double donors are formed in the regions in which oxygen is present. The doping profile formed upon application of such a method is illustrated in FIG. 5. This doping profile follows, in the shallow region, the concentration of the oxygen incorporation into the semiconductor body, the doping concentration being lower than the oxygen concentration.

The higher donor concentration in the region irradiated by the nondoping particles results from the higher defect density present there.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing a buried n-doped semiconductor zone in a semiconductor body comprising:
producing an oxygen concentration at least in a region to be doped in the semiconductor body, the semiconductor body including a float zone semiconductor material;
irradiating the semiconductor body via one side with nondoping particles for producing defects in the region to be doped, the nondoping particles comprising helium ions; and
carrying out a thermal process on the semiconductor body such that thermal double donors are formed.

2. The method of claim 1, wherein the thermal process is carried out at temperatures of between 380° C. and 500° C.

3. The method of claim 2, wherein the thermal process is carried out at temperatures of between 420° C. and 460° C.

4. The method of claim 1, comprising:
producing the oxygen concentration by heating the semiconductor body in an oxygen atmosphere.

5. The method of claim 1, comprising:
defining the oxygen concentration to be between $5\cdot10^{15}$ cm$^{-3}$ and $5\cdot10^{17}$ cm$^{-3}$.

6. The method of claim 1, comprising:
defining the nondoping particles to be at least one of a group consisting of helium ions, carbon ions or ions of a semiconductor material.

7. The method of claim 1, comprising:
defining the semiconductor body to be made of silicon.

8. The method of claim 1, comprising defining the irradiation dose of the nondoping particles to be between $10^9$ cm$^{-2}$ and $10^{13}$ cm$^{-2}$.

9. The method of claim 1, comprising defining a duration of the thermal process to be between 20 minutes and 10 hours.

10. The method of claim 9, comprising wherein the duration of the thermal process is between 20 minutes and 2 hours.

11. The method of claim 1, comprising wherein irradiating the semiconductor body is effected in masked fashion using a mask.

12. The method of claim 1, comprising defining the distribution of the oxygen concentration in the region to be doped is at least approximately homogeneous.

13. A method for producing a buried n-doped semiconductor zone in a semiconductor body comprising:
   producing an oxygen concentration at least in a region to be doped in the semiconductor body, the semiconductor body including a float zone semiconductor material;
   irradiating the semiconductor body via one side with nondoping particles for producing defects in the region to be doped, the nondoping particles comprising helium ions;
   irradiating the semiconductor body via one side with electrons; and
   carrying out a thermal process on the semiconductor body such that thermal double donors are formed.

14. The method as claimed in claim 13, comprising defining the distribution of the oxygen concentration in the region to be doped is inhomogeneous and decreases proceeding from the one side.

15. A method for producing a buried n-doped semiconductor zone in a semiconductor body comprising:
   producing an inhomogeneous oxygen concentration at least in the region to be doped in the semiconductor body, the semiconductor body including a float zone semiconductor material;
   irradiating the semiconductor body via one side with electrons for producing defects in the region to be doped; and
   carrying out a thermal step at temperatures of between 380° C. and 500° C. such that thermal double donors are formed.

16. The method of claim 15, comprising the duration of the thermal process to be between 20 minutes and 2 hours.

* * * * *